(12) United States Patent
Koushanfar

(10) Patent No.: US 8,176,448 B2
(45) Date of Patent: May 8, 2012

(54) METHOD FOR N-VARIANT INTEGRATED CIRCUIT (IC) DESIGN, AND IC HAVING N-VARIANT CIRCUITS IMPLEMENTED THEREIN

(75) Inventor: Farinaz Koushanfar, Houston, TX (US)

(73) Assignee: Empire Technology Development LLC, Wilmington, DE (US)

( * ) Notice: Subject to any disclaimer, the term of this patent is extended or adjusted under 35 U.S.C. 154(b) by 335 days.

(21) Appl. No.: 12/479,665

(22) Filed: Jun. 5, 2009

(65) Prior Publication Data

US 2010/0318945 A1 Dec. 16, 2010

(51) Int. Cl.
*G06F 17/50* (2006.01)
(52) U.S. Cl. .................. 716/102; 716/101; 716/104
(58) Field of Classification Search .............. 716/102
See application file for complete search history.

(56) References Cited

U.S. PATENT DOCUMENTS 7,454,323 B1 * 11/2008 Bain ........................... 703/13

OTHER PUBLICATIONS

Alkabani, Yousra; Koushanfar, Farinaz; "N-Variant IC Design: Methodology and Applications," Jun. 8, 2003, ACM, DAC 2008.*
Alkabani et al., "Active Hardware Metering for Intellectual Property Protection and Security," 16th USENIX Security Symposium, Aug. 2007, pp. 291-306.
Alkabani et al., "Remote Activation of ICs for Piracy Prevention and Digital Right Management," 2007 IEEE/ACM International Conference on Computer-aided Design, Nov. 2007, pp. 674-677.
Alkabani et al., "Input Vector Control for Post-Silicon Leakage Current Minimization in the Presence of Manufacturing Variability," 45th Design Automation Conference, Jun. 2008, pp. 606-609.
Avizienis, A., "The N-Version Approach to Fault-Tolerant Software," IEEE Transactions on Software Engineering, Dec. 1985, pp. 1491-1501, vol. SE-11, No. 12.
Cox et al., "N-Variant Systems: A Secretless Framework for Security through Diversity," 15th USENIX Security Symposium, Aug. 2006, 16 pages.
Devadas, S., "Approaches to Multi-Level Sequential Logic Synthesis," 26th ACM/IEEE Design Automation Conference, Jun. 1989, pp. 270-276.
Forrest et al., "Building Diverse Computer Systems," 6th Workshop on Hot Topics in Operating Systems, May 1997, 6 pages.
Holland et al., "An Architecture a Day Keeps the Hacker Away," 2004 Workshop on Architectural Support for Security and Anti-Virus, Sep. 2004, 8 pages.
Kam et al., "A Fully Implicit Algorithm for Exact State Minimization," 31st ACM/IEEE Design Automation Conference, Jun. 1994, pp. 684-690.
Kirovski et al., "Local Watermarks: Methodology and Application to Behavioral Synthesis," IEEE Transactions on Computer-Aided Design of Integrated Circuits and Systems, Sep. 2003, pp. 1277-1284, vol. 22, No. 9.
Koushanfar et al., "CAD-based Security, Cryptography, and Digital Rights Management," 44th Design Automation Conference, Jun. 2007, pp. 268-269. Randell, B., "System Structure for Software Fault Tolerance," International Conference on Reliable Software, Jun. 1975, pp. 437-449.
Yuan et al., "Information Hiding in Finite State Machine," Information Hiding: 6th International Workshop, May 2004, pp. 340-354.

* cited by examiner

*Primary Examiner* — Vuthe Siek
*Assistant Examiner* — Eric Lee
(74) *Attorney, Agent, or Firm* — Schwabe, Williamson & Wyatt, P.C.

(57) ABSTRACT

Techniques are generally described for designing an integrated circuit (IC). In various embodiments, the techniques include designing, at a functional specification level, N-variants of a particular circuit. The various embodiments may then implement the designed N-variants as hardware in the IC. Additional variants and embodiments may also be disclosed.

34 Claims, 9 Drawing Sheets

METHOD FOR N-VARIANT INTEGRATED CIRCUIT (IC) DESIGN, AND IC HAVING N-VARIANT CIRCUITS IMPLEMENTED THEREIN

STATEMENT REGARDING GOVERNMENT SPONSORED RESEARCH OR DEVELOPMENT

The work described herein was supported at least in part by National Science Foundation (NSF) grant no. 0716674, and at least in part by Defense Advanced Research Projects Agency/Microsystems Technology Office (DARPA/MTO) Young Faculty Award (YFA) grant no. W911NF-07-1-0198. The United States government may have certain rights to the subject matter disclosed herein.

BACKGROUND

Conventional integrated circuits (ICs) are typically used to implement a particular circuit design. The IC implementing the particular circuit design may be used for a number of different diverse applications, including media, networking and communications, personal computing, and so forth.

The circuit design implemented on such conventional ICs is generally singular in nature. That is, a single hardware instance of the circuit design is implemented on the physical "real estate" of the IC.

Such conventional single-circuit approaches have certain disadvantages. For example, the entire IC may become non-operational if a fault or damage is sustained by the single circuit. As another example, such single-circuit approaches may generally not be very resistant to hacker attacks directed towards the IC, unless sophisticated and expensive security mechanisms are put into place, since hackers may specifically tailor their attacks to the single circuit. Still further as an example, conventional approaches may be inflexible in that the single circuit may be limited to a single application and/or to a single function.

BRIEF DESCRIPTION OF THE DRAWINGS

Subject matter is particularly pointed out and distinctly claimed in the concluding portion of the specification. The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings. Various embodiments will be described referencing the accompanying drawings in which like references denote similar elements, and in which:

DETAILED DESCRIPTION OF ILLUSTRATIVE EMBODIMENTS

Figure 1:
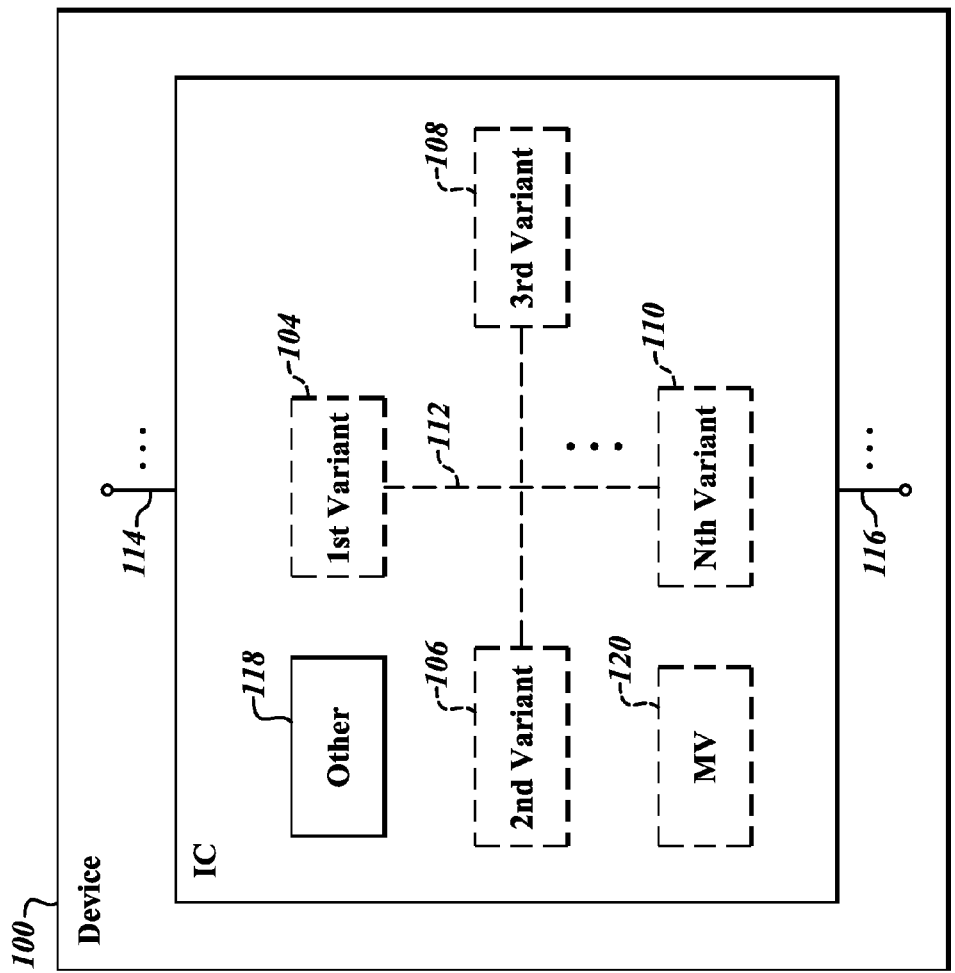
FIG. 1 illustrates an example device that includes an IC having N-variants of a circuit design, in accordance with various embodiments, FIG. 2 are state transition graphs (STGs) that respectively represent finite state machine (FSMs) of a circuit design having N-variants, in accordance with various embodiments.

The following description sets forth various examples along with specific details to provide a thorough understanding of the claimed subject matter. It will be understood by those skilled in the art, however, that claimed subject matter may be practiced without some or more of the specific details disclosed herein. Further, in some circumstances, well-known methods, procedures systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

In the following description, algorithms and/or symbolic representations of operations on data bits and/or binary digital signals stored within a computing system, such as within a computer and/or computing system memory may be presented. An algorithm is generally considered to be a self-consistent sequence of operations and/or similar processing leading to a desired result where the operations may involve physical manipulations of physical quantities that may take the form of electrical, magnetic and/or electromagnetic signals capable of being stored, transferred, combined, compared and/or otherwise manipulated. In various contexts such signals may be referred to as bits, data, values, elements, symbols, characters, terms, numbers, numerals, etc. Those skilled in the art will recognize, however, that such terms may be used to connote physical quantities. Hence, when terms such as "storing", "processing", "retrieving", "calculating", "determining" etc. are used in this description they may refer to the actions of a computing platform, such as a computer or a similar electronic computing device such as a cellular telephone, that manipulates and/or transforms data represented as physical quantities including electronic and/or magnetic quantities within the computing platform's processors, memories, registers, etc.

This disclosure is drawn, inter alia, to methods, apparatus, systems and computer program products related to designing and using N-variant circuits or "N-variants" implemented in an integrated circuit (IC).

As an overview, some embodiments may provide a method for designing and using N-variant circuits, such as sequential circuits, implemented or otherwise formed on an IC. In general, the N-variant design of some embodiments may involve the generation of $N \geqq 2$ circuit realizations from the same initial design description of a circuit. Features of one embodiment of the N-variant design method may include improved flexibility, robustness, attack resiliency, and design diversity. For example, in applications involving the security of computer systems, software, and data, N-variant circuits may be particularly useful. For instance, the effectiveness of many attacks that take advantage of the specific and stationary nature of single underlying platform/circuit may be reduced or eliminated by using N-variant circuits, as will be described in further detail below.

According to some embodiments of methods for designing N-variant circuits to be implemented on an IC, the heterogeneity of the N-variant circuits may be integrated/designed at the behavioral specification level or functional specification level. The subsequent stages/levels of the circuit design process may then synthesize or otherwise implement the N-variant circuits as hardware on the IC. In some embodiments, scripts may be provided that automatically perform pre-synthesis alterations/variations of the circuit design in order to generate the N-variants. Integrating the heterogeneity of the N-variants into the functional specification of the circuit design may provide flexibility in some embodiments, as removal, extractions, or deletions of the N-variants from the synthesized circuit may not be viable or practical, regardless of whether the N-variants were configured during the manufacturing stage or the post-manufacturing stage.

As explained previously above, conventional single-circuit approaches provide a single circuit that may be vulnerable to removal attacks, in which the security of the IC is compromised by removing, altering, or otherwise disabling the particular single circuit. In some embodiments, N-variants of a same circuit design may be provided by integrating the N-variants at a higher, functional specification level of the circuit design process, rather than initially designing the N-variant circuits at a lower level of abstraction (e.g., at a gate level) in the design process. For example, some embodiments alter the finite state machine (FSM) of the circuit design at the functional specification level, and add several states to the FSM in order to realize the N-variants.

One feature of designing the N-variant circuits from the FSM may be that the circuit design may not be extractable from the final synthesized circuit. In some embodiments, the heterogeneity of the N-variants may be provided through pre-synthesis alternation of the FSM of the circuit design, such that all of the N-variants become an integral part of the ultimately synthesized circuit's functionality. Thus, even if a potential attacker has access to the synthesized hardware of the circuit, changing the FSM or extracting the original single-variant design would need a (non-viable and impractical) effort equivalent to reverse engineering or otherwise redoing all the prior stages of the circuit design and synthesis process. Thus according to some embodiments, the FSM may be safely assumed to be inextricable and thus secure. Even though the FSM may be inextricable in the post-silicon realization of the IC, the functionality and other features of the FSM of some embodiments nevertheless may be verifiable in the post-silicon realization of the circuit design.

During operation of the IC, by managing or otherwise controlling the inputs and state transitions of the FSM, some embodiments may include selecting different variants of the circuit design to use for a particular application. As will be explained in further detail below, the management inputs may come from various triggers, which may be selectively chosen and configured based on the task of the target application of the IC having the N-variant circuits implemented therein.

In some embodiments that will be described below, the behavioral specification of the circuit may be integrated within the design and may be present in all lower levels of design abstractions, including but not limited to synthesis, netlist, the GDS-II files, and so forth. The N-variants of some embodiments may be inseparable at the post-synthesis stage.

Some embodiments of the N-variant design method, efficiently and with a low overhead, may embed the different variants within one IC using a single mask, without the need of modifying the mask in order to generate each of the N-variants.

In some embodiments, the FSM may be a computational model present in the circuit design. By modifying the FSM, the original circuit design may be modified to include multiple variants. In some embodiments, designing the IC with N-variants of the circuit in the IC may include: manipulation of the original finite state machine of the circuit such that the FSM may include multiple redundant states. The combinations of all the states may implement several versions of the original finite state machine in some embodiments. The added states may be either implemented in don't care states of the original finite state machine or additional flip-flops (FFs) in some embodiments.

The inputs to the finite state machine may be modified in some embodiments such that each version of the finite state machine may be selected by an input specification. Depending on the input, the modified finite state machine may yield a different set of output states in its FFs.

A method for implementing the FSM in some embodiments may include designing an N-version FSM by: adding redundant states in specific areas of the state transition graph that represents the original finite state machine of the design, modifying inputs of the FSM such that the inputs may control the added states, and adding outputs to the state transition graph. The added and the original FFs may store all the states.

Adding the states may be done in some embodiments by partitioning the combinational circuit into two parts; replicating the first part of the combinational circuit m times; partitioning the second part of the combinational circuit into a third and fourth part; devising inputs and obfuscation logic for insertion between the second and the replicated first part to select between the N variants; and designing the selection logic for insertion between the second part and the fourth part to select the output for a particular variant of the N possibilities.

In some embodiments, the states may be added at a pre-synthesis stage, which may ensure that the added states are inseparable from the original states at a post-synthesis stage, as such states may be stored in the same flip flops that store the states of the original design and reverse engineering of the FSM is known to be difficult.

In some embodiments, the FSM may be partially modified such that only a subset of states in the FSM is manipulated to contain the N-variants. As a result, the whole FSM may also have N-variants that differ in terms of the states in the modified subset of the states.

In some embodiments, a method may be provided for modification of the variant selection inputs such that the IC variant may be changed in field (at a post-synthesis stage) and during operation of the IC.

FIG. 1 illustrates an example device 100 that includes an IC 102 having N-variants 104-110 of a circuit design, in accordance with various embodiments of the present disclosure. In the illustrated example, the IC 102 may have implemented thereon a first variant 104, a second variant 106, a third variant, 108, and up to an Nth variant 110 of the particular (same) circuit design. In a relatively simple embodiment, the IC 102 may have only the first variant 104 and the second variant 106 (i.e., N=2). In relatively more complex embodiments, N may be in the order of dozens, hundreds, thousands, millions, or even greater numbers of variants. The value of N may be dictated by various considerations such as real estate availability on the IC 102, overhead and operational performance issues, particular application/use of the IC 102, and/or other factors that are explained later below.

In FIG. 1, the variants 104-110 are depicted in broken lines, so as to symbolically represent that rather than being readily identifiable, discrete, and redundant hardware cores, the individual and/or collective functionality of the variants 104-110 of one embodiment may be integrated within the overall hardware circuit structure of the IC 102. For example, at least some of the individual variants 104-110 may share common resources (such as flip-flops) and/or some of the individual hardware circuit elements of a particular one of the variants may also form the hardware circuit elements of another one of the variants. A broken line 112 symbolically represents the "sharing" of resources and/or hardware circuit elements between the variants 104-110, as well as symbolically representing any other hardware structure (such as logic circuits, control circuits, power supplies, and so forth) that may be operatively coupled to each of the variants 104-110 to support operation thereof.

The IC 102 may include at least one input terminal 114 and at least one output terminal 116. As will be explained in further detail below, one embodiment of the IC 102 may be arranged to receive a trigger or other control signal at the input terminal 114 to select one or more of the variants 104-110 for a particular application or use.

The IC 102 may include other structures 118 that may also implement other portions of the circuit design or that may otherwise support operation of the IC 102. For the sake of brevity, the other structures 118 are not described in further detail herein.

The IC 102 may have intrinsic manufacturing variability (MV) 120 that may result from the manufacturing process used to produce the IC 102. One or both of two types of MV 120 may be present in the IC 102: i) inter-die variations that include die-to-die fluctuations (e.g., variations between the IC 102 and another IC that implements the same circuit design); and (ii) intra-die variations that include the fluctuations present inside the single IC 102. The MV 120 is depicted in broken lines in FIG. 1, so as to symbolically represent that the variations are not explicitly provided as part of the circuit design and to further represent that the MV 120 may fluctuate within the IC 102 and/or between multiple ICs 102 that implement the same circuit design.

The device 100 may be, for instance, a cellular telephone, a laptop computer, a desktop computer, a network device (such as a server), or any other type of stationary or mobile electronic device that may benefit from using an IC 102 having the variants 104-110 implemented therein. An example of the device 100 having an IC 102 with the variants 104-110 may be a media player, which will be described later below with respect to FIG. 5, or some other type of computing device.

Figure 2:
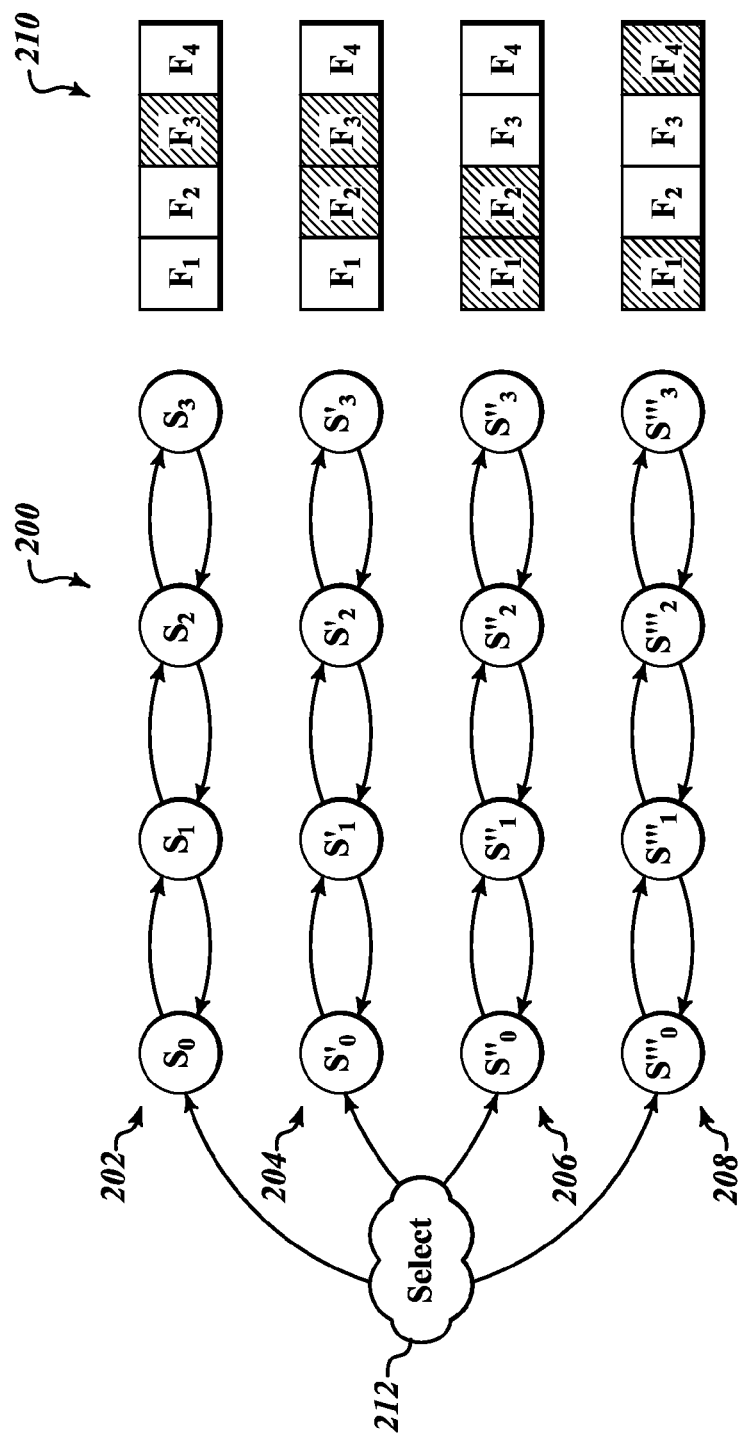

FIG. 2 illustrates state transition graphs (STGs) 200 that respectively represent finite state machines (FSMs) 202-208 of a circuit design having N-variants, in accordance with various embodiments of the present disclosure. A FSM may in general correspond to a dynamic discrete system with a limited number of states that map input sequences into output sequences. A FSM may be used to represent a sequential function, such as sequential circuits. A FSM may be typically defined by a 6-tuple M=($\Sigma$, $\Delta$, Q, $q_0$, $\delta$, $\lambda$), wherein:

$\Sigma \neq 0$ is a finite set of input alphabets;

$\Delta \neq 0$; is a finite set of output alphabets;

$Q=\{q_0, q_1, \ldots\} \neq 0$; is a bounded set of states;

$q_0 \subset Q$ is the set of initial states;

$\delta(q, a)$ is transition function on input a and set $Q \times \Sigma \rightarrow Q$; and $\lambda(q, a)$ is output function for input a and set $Q \times \Sigma \rightarrow \Delta$.

The STG 200 may be used to represent the state transitions and input/output relations of the FSMs 202-208. Nodes of the STG 200 correspond to states and edges of the STG 202 define the input/output conditions for state transitions.

In some embodiments, the functionality of the N-variants may be inter-wound within the original circuit design. Furthermore, in some embodiments, the N-variant design method may be devised to have low overhead. State assignment and state minimization methods for FSM networks may be used in one embodiment to help lower the overhead of the N-variant designs.

The FSM 202 of the circuit design may be shown by a STG that has four states: $s_0$, $s_1$, $s_2$, and $s_3$. This FSM 202 may represent the first variant. The FSM 202 of the circuit design may be then replicated three times to have: states $s'_1$, $s'_2$, $s'_3$, and $s'_4$ as the first copy (the second variant or FSM 204), states $s''_1$, $s''_2$, $s''_3$, and $s''_4$ as the second copy (the third variant or FSM 206), and $s'''_1$, $s'''_2$, $s'''_3$, and $s'''_4$ as the third copy (the fourth variant or FSM 208). Thus, a 4-variant (N=4) circuit may be constructed.

According to some embodiments, the FSMs 202-208 of FIG. 2 may be integrated in or otherwise designed at one or more functional specification levels of the circuit design process. For instance, the FSMs 202-208 may be represented in a behavioral design description (e.g., in a behavioral algorithm) that may form an input into a behavioral synthesis process usable to synthesize a circuit design. Alternatively or additionally, the FSMs 202-208 may be generated or otherwise represented at some other functional specification level in the circuit design process, such within one or more sub-levels of abstraction within the behavioral synthesis process and/or perhaps within a subsequent register transfer level (RTL) or other lower level of abstraction of the circuit design process.

According to some embodiments, the different copies (e.g., the FSMs 202-208) may share a common plurality of flip-flops (FFs) 210 and/or other hardware elements, so as to reduce the overhead. For the sake of simplicity of explanation herein, such shared hardware elements will be described herein in the context of flip-flops, however, other embodiments may share other types of hardware elements, alternatively or additionally to flip-flops.

Utilizing state assignments, some embodiments may ensure that the FFs 210 needed for each variant to function properly are different in at least one other variant. This way, even if a particular FF is corrupted, damaged, or otherwise fails to operate properly, there are still other variants that may function properly using other FFs.

FIG. 2 shows an example embodiment where the FFs 210 may be shared between the different variants 202-208. For instance in a design that uses four FFs 210, the four FFs 210 may be denoted by $F_1$, $F_2$, $F_3$, and $F_4$ next to each respective variant 202-208 in FIG. 2. In this example, the unshaded FFs affect the functionality of the particular variant, while the shaded FFs do not affect the functionality of that particular variant (although in some embodiments, such shaded FFs may change at various times for obfuscation reasons or for other reasons depending on the application).

In the example of FIG. 2, the first variant 202 may use the flip-flops $F_1$ and $F_2$, while the flip-flops $F_3$ and $F_4$ need not necessarily affect the functionality of the first variant 202. The second variant 204 may be affected by the flip-flops $F_1$ and $F_4$. Thus, for example, if the flip-flop $F_2$ is corrupted, the first variant 202 may not function properly, but the second variant 204 may function properly since the flip-flop $F_2$ may not affect the functionality of the second variant 204. According to some embodiments, for the circuit design to properly function, it may be sufficient to have one correctly functional variant that is selected.

However in some embodiments and depending on the particular application, switching between different variants may be provided and/or a particular variant may be preferred over another variant based on their performance or based on some other factor. Thus, a selection element 212 shown in FIG. 2 to select amongst the variants may be application-dependent and/or usage-dependent as will be described below with respect to FIG. 6.

One example of such an application that utilizes the selection function 212 involves improved security. With most systems that are homogeneous (as opposed to heterogeneous systems provided through an N-variant design), the same exploit may attack all instances of the system. The specific machine-level characteristics of the attacked system are used by the binary exploits (e.g., byte order, calling conventions, program load addresses, etc.) to often successfully breach the security of the system. If the instances of the system are not exactly the same (as would be provided through an N-variant design), then the exploit would be unable to adjust itself and the attack would be halted or would otherwise be unsuccessful. The switching function 212 of one embodiment, for example, enables the system to switch to a particular variant that is an incompatible target of the exploit.

A heterogeneous system achieved through one embodiment of N-variant design may be used for many more tasks other than just security and attack resiliency. For instance, possible applications may be provided for intellectual property (IP) protection, for enabling new business models, and for post-silicon optimization and self-adaptations of ICs. Furthermore, because the N-variants are embedded into the hardware of the IC, the overhead is smaller than embedding them into a virtual machine and/or a system architecture. The low overhead of the IC 102 having the variants 104-110 thus renders one embodiment of the IC 102 suitable for embedded systems applications.

Figure 3:
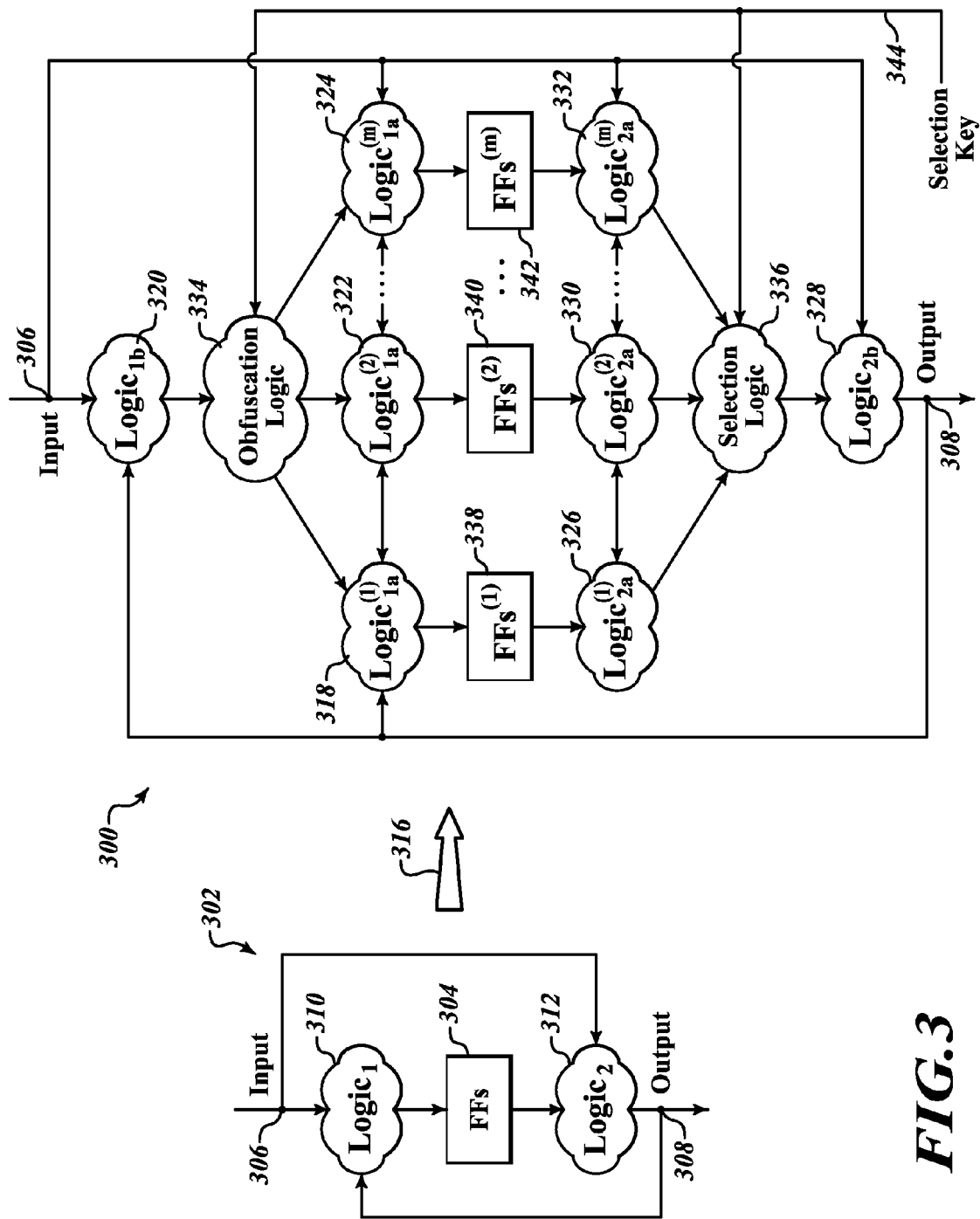
FIG. 3 is a flow block diagram of an example method for and example elements involved in designing an N-variant circuit, in accordance with various embodiments.

FIG. 3 is a flow block diagram of an example method 300 for and example elements involved in designing an N-variant circuit, in accordance with various embodiments of the present disclosure. A single copy of the original FSM 302 of the circuit design may be represented as a group of FFs 304 connected to an input 306 and an output 308 through a respective first combinational circuit 310 ($logic_1$) and a second combinational circuit 312 ($logic_2$).

A modification/alteration (symbolically represented at 316) of the FSM 302 may be as follows for some embodiments:

a parameter m may be selected to represent the number of replications of the FFs in the N-variant circuit design, so as to yield a number m of replicated FFs 338-342 ($FFs^{(1)}$, $FFs^{(2)}$, ... $FFs^{(m)}$), such that m^(a number of the flip-flops FF)=N. For example, if the original circuit design has 30 FFs and m=2, the modified design may have 2^30 variants/versions.

The first combinational circuit 310 ($logic_1$) may be partitioned into a first logic circuit 318 ($logic_{1a}^{(1)}$) and a second logic circuit 320 ($logic_{1b}$). The first logic circuit 318 may then be replicated m times to obtain subsequent logic circuits 322-324 ($logic_{1a}^{(2)}$ up to $logic_{1a}^{(m)}$).

The second combinational circuit 312 ($logic_2$) may also be partitioned into a third logic circuit 326 ($logic_{2a}^{(1)}$) and a fourth logic circuit 328 ($logic_{2b}$). The third circuit 326 may then be replicated m times to obtain subsequent logic circuits 330-332 ($logic_{2a}^{(2)}$ up to $logic_{2a}^{(m)}$).

Obfuscation logic 334 and selection logic 336 may then be designed to maintain the circuit's correct functionality. The obfuscation logic 334 of some embodiments may be coupled to the input side and may be used to distinguish between different variants (for example, by adjusting the inputs for the variants), and may further be used to generate dummy values in unused FFs. The selection logic 336 may be coupled to the output side to select the output of the target/desired variant. In some embodiments, control of the obfuscation logic 334 and/or the selection logic 336 may be provided by way of a selection key input 344.

According to some embodiments, an unselected variant need not necessarily generate correct outputs. In some embodiments, unselected variants may be idle or otherwise not operate, while using the selected variant.

The selection of the number of replications m, and the manner in which the combinational circuits 310 and 312 are partitioned, form the state-space of all possible implementations. Minimal complexity of the obfuscation logic 334 and the selection logic 336 may be provided regardless of the selected number m and/or the manner of partitioning the combinational circuits 310 and 312. In some embodiments, the choice of m and/or the manner of partitioning may be also affected by the particular application targeted by the N-variant design method 300.

According to some embodiments, the overhead of the eventual/synthesized hardware implementation may vary with the choice of m, the partitioning of the combinational circuits 310 and 312, and the complexity of both the obfuscation logic 334 and the selection logic 336. The area (real estate) and power overheads may be affected mainly by m and by the partitioning of the combinational circuits 310 and 312. In comparison, the delay may generally be affected by the obfuscation logic 334 and the selection logic 336.

At one extreme, some embodiments may set m=N, $logic_{ia}$=$logic_i$, and $logic_{ib}$=0, while implementing the selection logic 336 as a multiplexer and discarding the obfuscation logic 334. This example configuration may produce the highest (or at least improved) area and power overheads, and may produce the lowest (or improved) delay. At the other extreme, some embodiments may set m=1, $logic_{ia}$=0, $logic_{ib}$=$logic_i$. This example configuration may lead to an obfuscated circuit, produces the lowest area and power overheads, and may produce the highest delays.

The potential impact of each of the possible design parameters/elements of the method 300 of FIG. 3 may be as follows:

FFs: The FFs may represent the memory for the FSM states. The FFs may be replicated m times where m≧1; m=1 means the FFs may all be shared and this sharing may remove a large amount of redundancy in some embodiments. However, with m=1, the method 300 may, in some embodiments, provide multiple variants in response to manipulation of the logic blocks (e.g., by partitioning and replicating the partitioned combinational circuits 310 and 312).

$Logic_1$: The combinational circuit 310 may represent the combinational part of the circuit at the input side of the FFs 304. As explained above, the combinational circuit 310 may be divided into two parts: $logic_{1a}$ and $logic_{1b}$. $Logic_{1a}$ may be replicated m times, and $logic_{1b}$ may be shared in some embodiments. Increasing the size of $logic_{1a}$ may lead to larger area and power overheads. However, $logic_{1a}$ may not affect the delay overhead. Despite the introduction of more area and power overheads, embodiments that increase the size of $logic_{1a}$ through replication may be useful for applications with timing constraints, since the delay overhead may not be affected.

$Logic_2$. The combinational circuit 312 may represent the combinational part of the circuit at the output side of the FFs 304. As explained above, the combinational circuit 312 may be divided into two parts: $logic_{2a}$ and $logic_{2b}$. $Logic_{2a}$ may be replicated m times, and $logic_{2b}$ may be shared. Similar to the case with $logic_{1a}$, increasing the size of $logic_{2a}$ may lead to larger area and power overheads, but may be useful for applications that target performance improvement and fault-tolerance.

Obfuscation logic 334: As explained above, the obfuscation logic 334 may be used to adjust the inputs for different variants. As the number of FFs shared between variants increases, the complexity of the obfuscation logic 334 may increase. However, in cases where a few FFs are shared, the obfuscation logic 334 may be used to generate dummy values in the unused FFs. This feature may be useful for security applications.

Selection logic 336: As explained above, the selection logic 336 may be used to select the correct output from the desired target variant. In a situation involving many FF replications, the selection logic 336 may be implemented as a multiplexer, for example. Moreover, as the number of shared FFs increases, the selection logic 336 may be interleaved with the obfuscation logic 334 so that the correct outputs are obtained regardless of the selected variant.

The nature of the original circuit design may also affect the significance of the overhead in some embodiments. For instance, if the combinational logic 310 and/or 312 are small in terms of area, power, and delay, a small number of replications m and simple obfuscation logic 334 and selection logic 336 may yield significant overhead compared to the overhead of the original design (without the variants). It is noted that the area and power overhead of an FSM (representing the control part of a system) may be markedly smaller in some embodiments, compared to the overall area and power overhead of the system.

Figure 4:
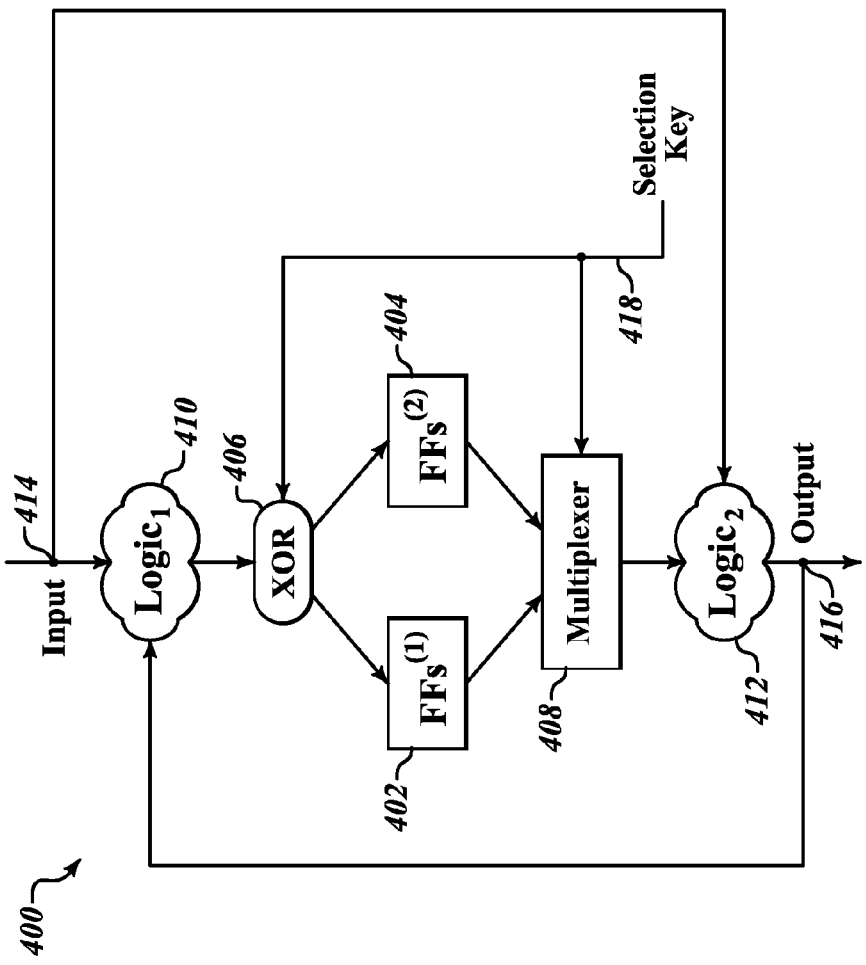
FIG. 4 is a flow block diagram of illustrating the design of a specific example of an N-variant circuit using the method of FIG. 4, in accordance with various embodiments.

FIG. 4 is a flow block diagram of illustrating the design of an example of an N-variant circuit 400 using the method 300 of FIG. 4, in accordance with various embodiments of the present disclosure. In the example of FIG. 4, the parameter m has been set to m=2, such that the design embeds at least one redundant component, while maintaining low area, power, and delay overheads. Setting the parameter m to m=2 in this example translates to doubling the number of FFs to two FFs 402 ($FFs^{(1)}$) and 404 ($FFs^{(2)}$) in the design.

Obfuscation logic may be implemented as a block 406 of XOR gates that place different values in the unused FFs for each variant. Selection logic may be implemented as a multiplexer block 408. Control of the obfuscation logic 334 and/or the selection logic 336, such as to select a particular variant and its output, may be provided by way of a selection key input 418.

The number of variants generated by this m=2 implementation for an original circuit design with k FFs is 2k variants. Example parameters/components of this N-variant design and example impacts of these design choices on the target application(s) may be as follows:

FFs: Selecting m=2 may ensure that the design has at least one spare FF for each variant.

$Logic_1$: For a combinational circuit 410 ($logic_1$) coupled to an input 414, the example selects $logic_{1a}$=0 and $logic_{1b}$=$logic_1$. These choices may be made to reduce the area and power overheads. Fault-tolerance and post-silicon optimization (explained later below) in the particular application of the IC 102 may now become dependent on the redundancies of the FFs 402 and 404.

$Logic_2$: For a combinational circuit 412 ($logic_2$) coupled to an output 416, the example selects $logic_{2a}$=0 and $logic_{2b}$=$logic_2$. These choices may be made to reduce the area and to reduce the delay and power overhead. Again, fault-tolerance and post-silicon optimization may now become dependent on the redundancies of the FFs 402 and 404.

Obfuscation logic: For m=2, half of the FFs 402 and 404 may be shared respectively. The example selects the obfuscation function to be the block 406 of XOR gates that generate dummy values in the unused FFs. The maximum number of variants in this example (for m=2) may be limited to 2k so as to keep the function simple and to constrain the delay overhead. It is noted that some of the variants may be reserved as trap non-functional FSMs for security and IP protection applications (explained in further detail below).

Selection logic: The example implements selection logic as the multiplexer 408 and is kept relatively simple to avoid large delay overheads.

As evident from the above explanation of the example of FIG. 4, the parameter choices used in a particular implementation may be driven by a designer's target application. The overhead and/or the final results/performance of the synthesized circuit may be affected by various factors such as the original shape of the circuit, the gate library used, and different optimizations performed on the circuit after modification to generate the N-variants. Indeed in some embodiments, the area, power, and delay overheads may be very small or even "negative" (e.g., the circuit is improved by designing N-variants) because the resulting circuit maps to fewer gates.

Figure 5:
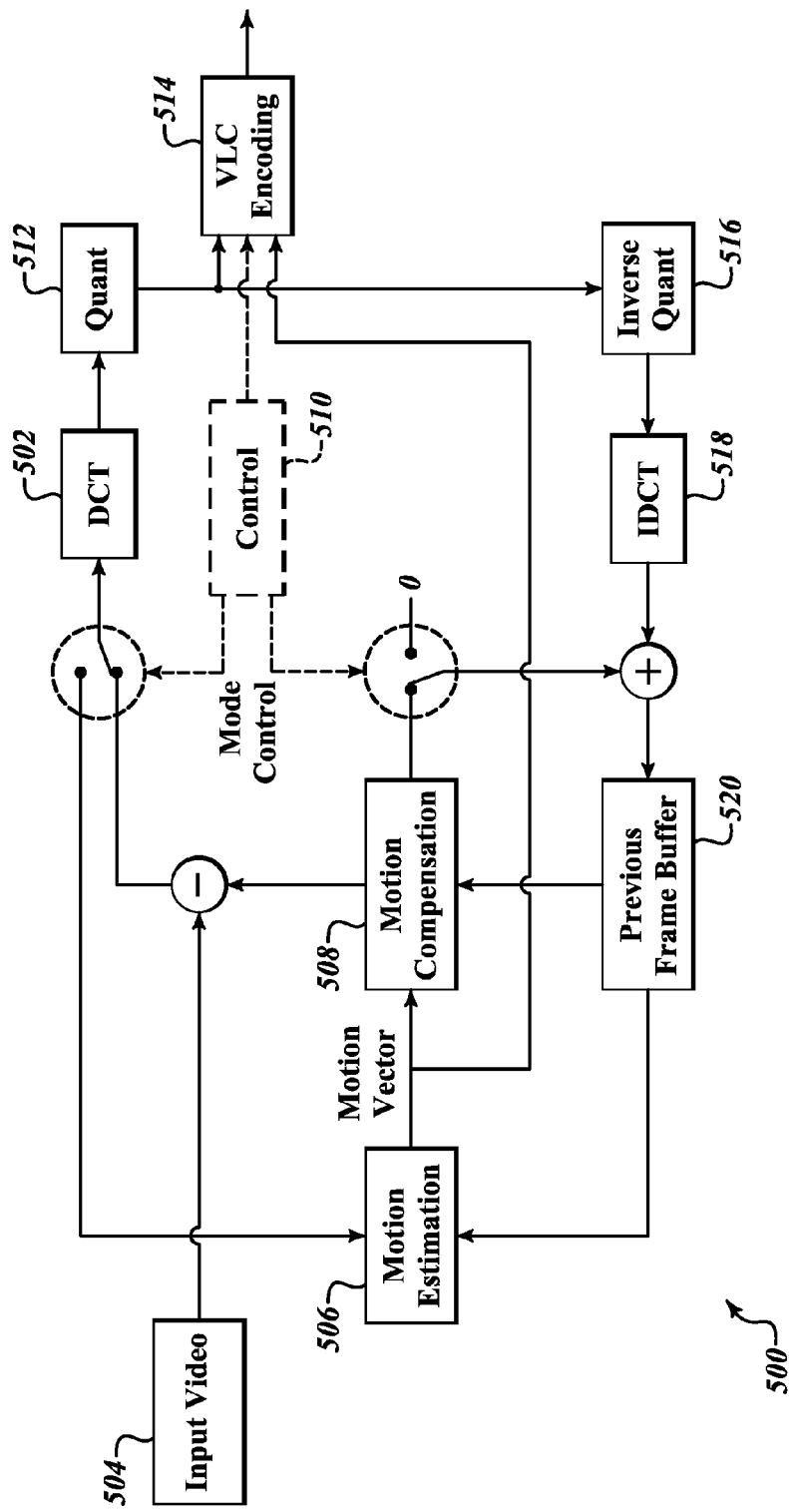
FIG. 5 is a block diagram of an example media player having a component designed with N-variants, in accordance with various embodiments.

FIG. 5 is a block diagram of an example media player 500 having a component designed with N-variants, in accordance with various embodiments of the present disclosure. More particularly, the media 500 has a discrete cosine transform (DCT) block 502 that has been implemented with N-variants using the techniques described above. One embodiment of the media player 500 that includes the DCT block 502 having N-variants may be used for content-usage metering for embedded multimedia applications (described further below), as one example implementation.

In the embodiment of FIG. 5, the original circuit represented by the DCT block 502 may have had nine FFs, for example. In an N-variant implementation, the DCT block 502 may then be provided with 29 variants (m=2), $2^{18}$ variants (m=4), $2^{36}$ variants (m=8), or any other number of variants, as just some examples.

The media player 500 of FIG. 5 may be configured to receive input video 504 and provides an example of a low overhead implementation in which the N-variants may not need to be implemented in all parts of the design of the media player 500. The N-variants may be implemented in one or a just a few of the components of the design, such that only certain parts of the design may be strategically selected and augmented. In the example of FIG. 5, the N-variants are implemented in the DCT block 502 of the design, since the DCT block 502 is substantively involved in the audio, image, and video signal processing functions of the media player 500.

Other components of some embodiments of the media player 500 may include a motion estimation block 506 configured to provide a motion vector to a motion compensation block 508, a control block 510 to control modes of the media player 500, a quantization block 512 configured to quantize output from the DCT block 502, a variable length code (VLC) encoding block 514, an inverse quantization block 516, an inverse DCT block 518, a previous frame buffer block 520, and other components. For the sake of simplicity and brevity, the specific functions and operation of these other blocks of the media player 500 will not be described in further detail herein, since such functions/operations are part of a typical MPEG video compression flow. In some embodiments, one or more of these other components of the media player 500 may be designed with N-variants, alternatively or additionally to the DCT block 502.

Figure 6:
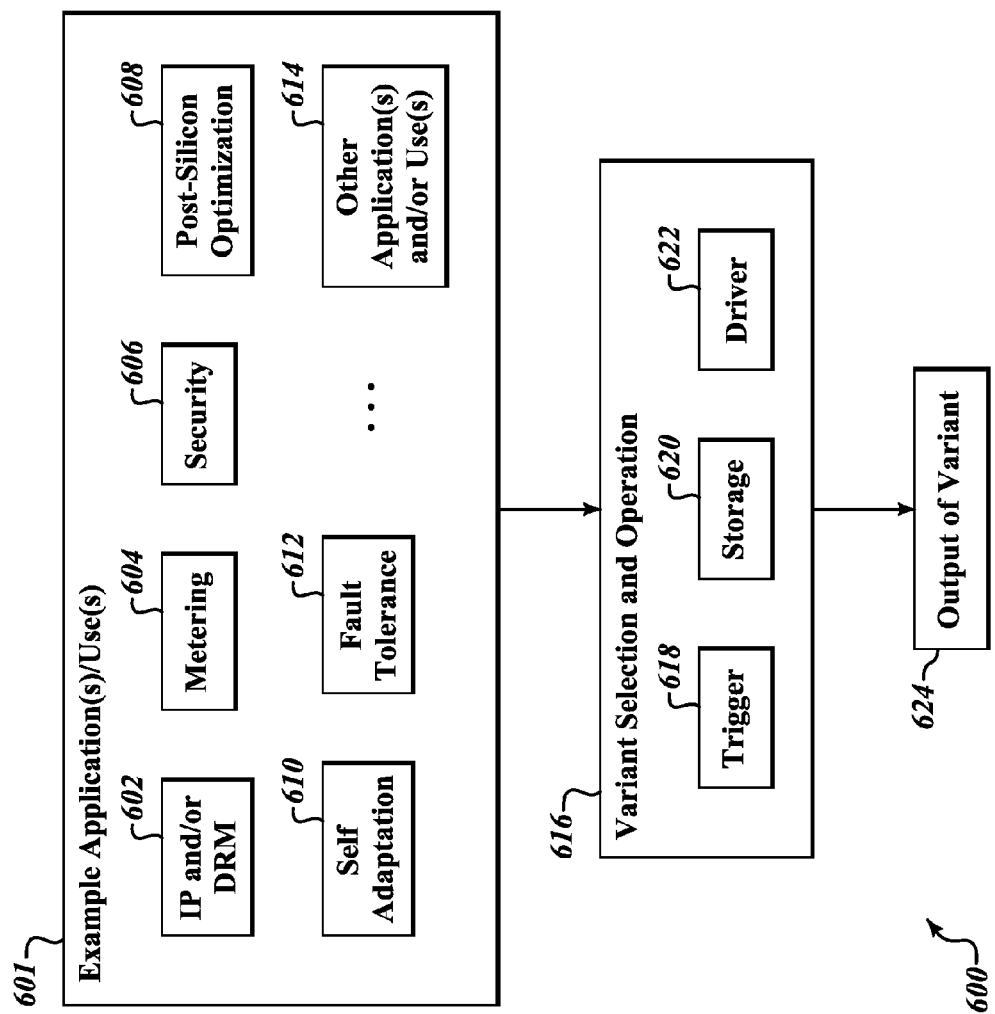
FIG. 6 is a flow block diagram illustrating example application(s)/use(s) and operation of the IC having the N-variants of FIG. 1, in accordance with various embodiments.

FIG. 6 is a flow block diagram 600 illustrating example application(s)/use(s) and operation of the IC 102 having the N-variants 104-110 of FIG. 1, in accordance with various embodiments of the present disclosure. A block 601 (Example Application(s)/Use(s)) shows some possible target applications/uses that may be selected for one or more ICs 102 having the N-variants 104-110 implemented therein. The example applications/uses at the block 601 may include, but not be limited to, the following:

A. Hardware intellectual property (IP) protection and digital rights management (DRM) 602: Semiconductor business models may be enabled by one embodiment of the N-variant design (e.g., different versions of one circuit design may be sold by an IC vendor to various customers, thereby enabling an automatic method to trace the ICs 102 in the supply chain). To provide this feature, the IC vendor may configure its chips by using a fixed key specific to each customer and specific to one or more variants of the circuit design. Also, many other hardware IP protection methods may be readily used in N-variant settings. For example, the sequence of traversal among a few variants or within a variant may be utilized as a watermark or for hiding information. As another example, the N-variant structure may be integrated with the unique random number generated on each chip, thereby enabling the manufacturer to perform fingerprinting or locking of the state transitions.

B. Usage and content metering 604: The variants may be used in one embodiment for enumerating/defining the particular usage of the component(s) of the ICs 102 that run software/media files. For instance, media files may be made such that they may run on a certain variant and may not be played on another variant. The variants may also be used in conjunction with chip IDs for metering and controlling the usage of ICs. For instance, N-variants may be used to enforce a licensing agreement for the hardware, software, or content usage—once the term (e.g., number of playbacks of a media file, duration, etc.) specified in the license agreement is over, the IC 102 may enter a non-functional state. Further, the owner of the IP rights may be provided as the only entity that may load a new functional variant if a new license is obtained. In some embodiments, a trigger by a clock or an internal counter may be used to save the number of uses or the time constraints. In case a counter is used, the states may be saved in an on-chip nonvolatile memory so that a reset of the IC 102 would not affect the usage metering. In some embodiments, the counter may be randomized, so that re-setting to zero would not traverse to a zero-usage state. As still another example, counter obfuscation methods may be used so that different counter configurations are provided depending on the unique IDs of each chip.

C. Security 606: Some embodiments may address the need to prevent the success of exploits/attacks that target a homogeneous design. Providing the different variants 104-110 in the ICs 102 may provide an effective countermeasure against such attacks. For example, a heterogeneous system having the IC 102 that includes the variants 104-110 may be made more secure by frequently alternating the variants of the FSM. For example, in the case of exploits that target a fixed memory address, the memory may be duplicated to create a master copy and a slave copy. Then, every time a new variant is selected, the master and the slave copies may switch: The slave may copy its content from the master, and if an attack exploits an address on the master copy, the attack would halt once the master copy is altered.

D. Post-silicon optimization 608: Because of the manufacturing variability (MV) 120 in each IC 102, the designer may use MV testing results in some embodiments to select a particular variant that provides the best power/delay characteristics within the IC 102. As an example, because of the variability in CMOS technology, the variant with the best power/delay performance may be different on each IC 102, and each IC 102 may be optimized by selecting its respective best-performing variant.

E. Self-adaptation 610: Due to the impact of variability in operational conditions (e.g., aging), the IC 102 of some embodiments may be designed such that the IC 102 may adapt its structure over time, such as by selecting different variants to be used/operated over time. For example, the variants may be strategically selected using an offline or online monitoring method that manages the selection based on a certain target. To be resilient against aging, some embodiments may equalize the amount of usage of each variant. Offline simulation of randomly selected variants or other technique may be used to determine which components are used more in one variant. The variants with the lowest usage patterns may be periodically selected for use, so as to equalize the aging effect amongst the variants.

F. Fault-tolerance 612: The inherent redundancy provided by N-variants may enable fault-tolerance in some embodiments, since if a particular variant becomes corrupted or otherwise inoperable, another one or more of the variants on the IC 102 may be substituted for the corrupted variant. As another example, if a particular FF is shown to be faulty during a test phase, the variants that do not use this FF may be selected for use. The fault-tolerance may be implemented in other ways in some embodiments, by adding a monitoring mechanism, for example a built-in self-test (BIST) structure in the IC 102 that periodically tests the N-variant circuits for faults due to aging, negative bias temperature instability (NBTI), and/or other effects. Then, the appropriate variants that may not be adversely affected by these effects may be selected for use.

G. Other application(s)/use(s) 614: The examples described herein are just a few of the possible applications/ uses of N-variant design. Other applications/uses may be provided that are based on one or more ICs 102 provided with N-variant circuits.

Based on the example application(s)/use(s) 601 for the IC 102, a block 616 (Variant Selection and Operation) may then show some of the elements that may be involved in selecting a particular variant for the particular application/use and operating the selected variant, in accordance with various embodiments.

To enable application-specific management of the N-variants, some embodiments may provide a trigger 618. The trigger 618 may originate from within the IC 102 and/or from outside of the IC 102, and may be configured to prompt selection of a particular variant. The trigger 618 may come from various sources, and may be in the form of clock signals, an internal counter, a sequence of inputs, or an external signal, as examples.

To enable application-specific management of the N-variants, some embodiments may provide a storage unit 620. The storage unit 620 may be in the form of a memory, for example if selection of a particular variant has been dictated by a key stored in the memory and/or for example if a counter has been provided that tracks usage of the variants. Also, since many binary attacks may exploit a fixed memory address, all or some parts of the memory may be duplicated as explained above.

To enable application-specific management of the N-variants, some embodiments may provide a driver 622. The driver 622 may be configured to upload a particular variant in case the trigger 618 is activated. The driver 622 may be in the form of a multiplexer configured to upload the variant selection key 344 of FIG. 4 or 418 of FIG. 4 from a stored location (such as the storage unit 620), a driver of a FSM (e.g., an obfuscated counter), or other component.

At a block 624 (Output of Variant), the selected variant operates and generates an output based on the particular application/use. For instance, the output at the block 624 may be the video playback in a particular format, if the IC 102 includes a selected particular variant that is configured to operate using the particular format and not other video formats.

Figure 7:
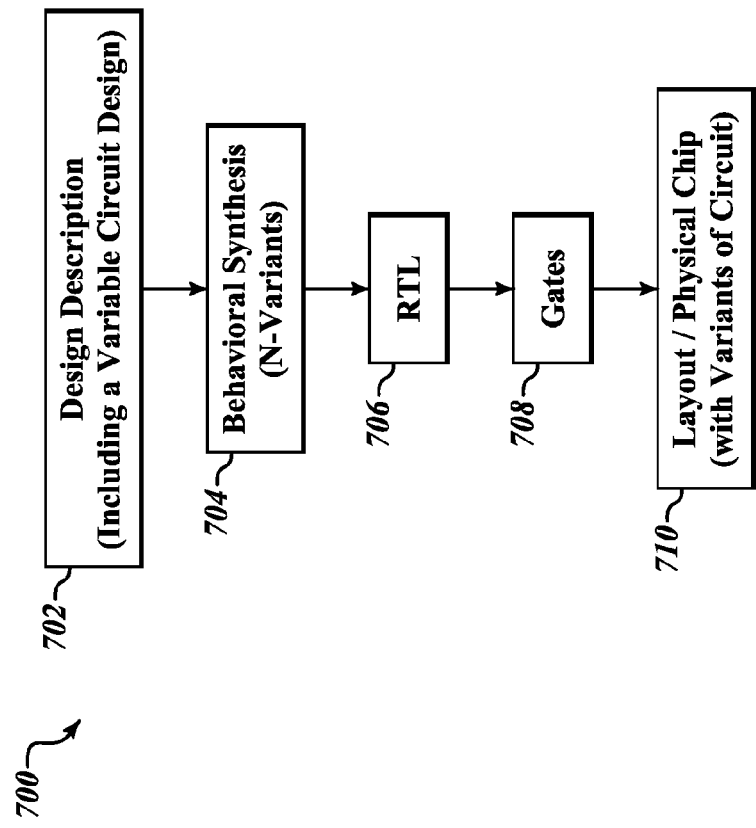
FIG. 7 is a flowchart of a method for designing and synthesizing the IC of FIG. 1 having the N-variants, in accordance with various embodiments.

FIG. 7 is a flowchart of a method 700 for designing and synthesizing the IC 102 of FIG. 1 having the N-variants 104-110, in accordance with various embodiments of the present disclosure. Some embodiments may provide an article of manufacture that includes a tangible computer-readable medium (such as a memory or other physical storage device) having stored thereon, computer-executable instructions that, when executed by a computing device, cause the computing device to perform or assist a designer to perform at least some of the operations of the method 700. An example embodiment of such a computing device is the computing device 900, which will be described further below with respect to FIG. 9. An example of the computer-readable medium may be the computer program product 800 of FIG. 8. The method 700 may include one or more functional operations illustrated by blocks 702, 704, 706, 708 and/or 710.

A block 702 (Design Description) provides an input to the method 700. According to some embodiments, the input at the block 702 may take the form of a behavioral design description (a behavioral algorithm) of a circuit design. For instance, the circuit design at the block 702 may be described in terms of the circuit's function using any suitable high-level procedural language (such as C or C++) that is stored in one or more plain text source files, for example.

In some embodiments, the description of the function(s) of the circuit design at the block 702 may be "complete" such that the functionality of at least one or more of the N-variants of a variable circuit design is specified in the original description. Alternatively or additionally in some embodiments, the specification of the function(s) of the circuit design at the block 702 may describe only a single circuit (a single variant), and then one or more subsequent lower levels (other functional levels) of abstraction in the method 700 may generate the variants of the original single circuit design.

A second input (not shown) to the method 700 according to some embodiments may be a set of descriptions of library components, each of which defines characteristics of digital components (such as flip flops, logic gates, and the like) to be used as building blocks in constructing the output circuit design.

One or more tools, such as a software tool (or other computer-readable instruction stored on a tangible computer-readable storage medium and which is executable by one or more processors) may read these source files and building block component descriptions as its input specification. The tool begins by parsing the source files and translating them into one or more data structures, such as, for example, a control and data flow graph (CDFG) or other suitable representation of the logical content of the original behavioral algorithm.

The input description to be processed at a next block 704 (Behavioral Synthesis) may thus be prepared. Behavioral synthesis at the block 704 according to some embodiments may include a process that may be performed by various tools to conduct a series of transformations on the CDFG data structures so as to produce a fully scheduled design that is bound to a set of building block components. According to some embodiments, the behavioral synthesis at the block 704 performs at least some of the transformation and other operations such as depicted in the method 300 previously described above, so as to replicate FFs, partition logic circuits, generate and arrange logic blocks, and other operations associated with generating the N-variants from the original design description, such as previously explained above.

Specific further details of example techniques for behavioral synthesis that may be used at the block 704 to generate N-variants are omitted herein, for the sake of brevity, since such details would be familiar to those skilled in the art having the benefit of this disclosure.

The output of the behavioral synthesis at the block 704 may be provided to a block 706 (RTL) as a body of register transfer level (RTL) code that describes the design having N-variants. After the block 706, a block 708 (Gates) may provide logic synthesis tools that generate a gate design, which may then be transformed into the layout for the IC 102 at a block 710 (Layout/Physical Chip) that has the N-variant circuits implemented thereon. The layout of the IC 102 may then be provided to a fabrication facility to complete the implementation of the N-variants on a physical IC 102.

Figure 8:
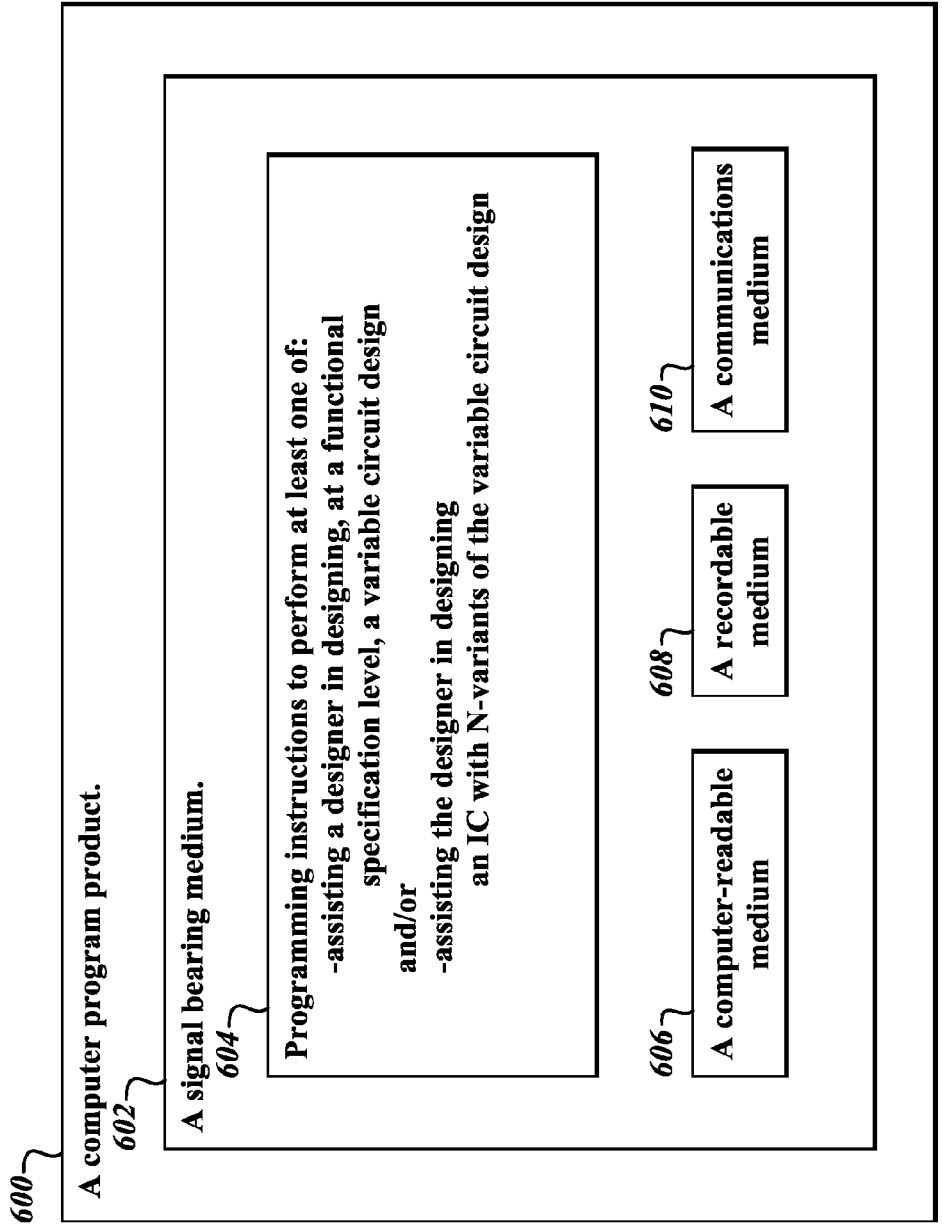
FIG. 8 illustrates an article of manufacture including a computing program product, in accordance with various embodiments.

FIG. 8 illustrates an example article of manufacture including a computing program product 800, in accordance with various embodiments of the present disclosure. In various embodiments, the computing program product 800 may comprise a signal bearing medium 802 having programming instructions stored therein. The computing signal bearing medium 802 may be, for example, a compact disk (CD), a digital versatile disk (DVD), a solid-state drive, a hard drive, or other appropriate type of data/instruction storage medium. The computing signal bearing medium 802 may have stored therein in a number of programming instructions 804. The programming instructions 804 when executed by a processor of an apparatus may cause the apparatus to assist a designer in designing, at a functional specification level, a variable circuit. In various embodiments, when executed, the programming instructions 804 may also cause the apparatus to assist a designer in designing an IC with N-variants of the variable circuit. The N-variants may be physically synthesized on and inextricable from the IC. Embodiments are not limited to any type or types of computing program products.

In various embodiments, the signal bearing medium 802 may include a computer readable medium 806, including but not limited to a CD, a DVD, a solid-state drive, a hard drive, computer disks, flash memory, or other appropriate type of computer readable medium. In various embodiments, the signal bearing medium 802 may also include a recordable medium 808, including but not limited to a floppy disk, a hard drive, a CD, a DVD, a digital tape, a computer memory, a flash memory, or other appropriate type of computer recordable medium. In various embodiments, the signal bearing medium 802 may include a communications medium 810, including but not limited to a fiber optic cable, a waveguide, a wired or wireless communications link, etc.

Figure 9:
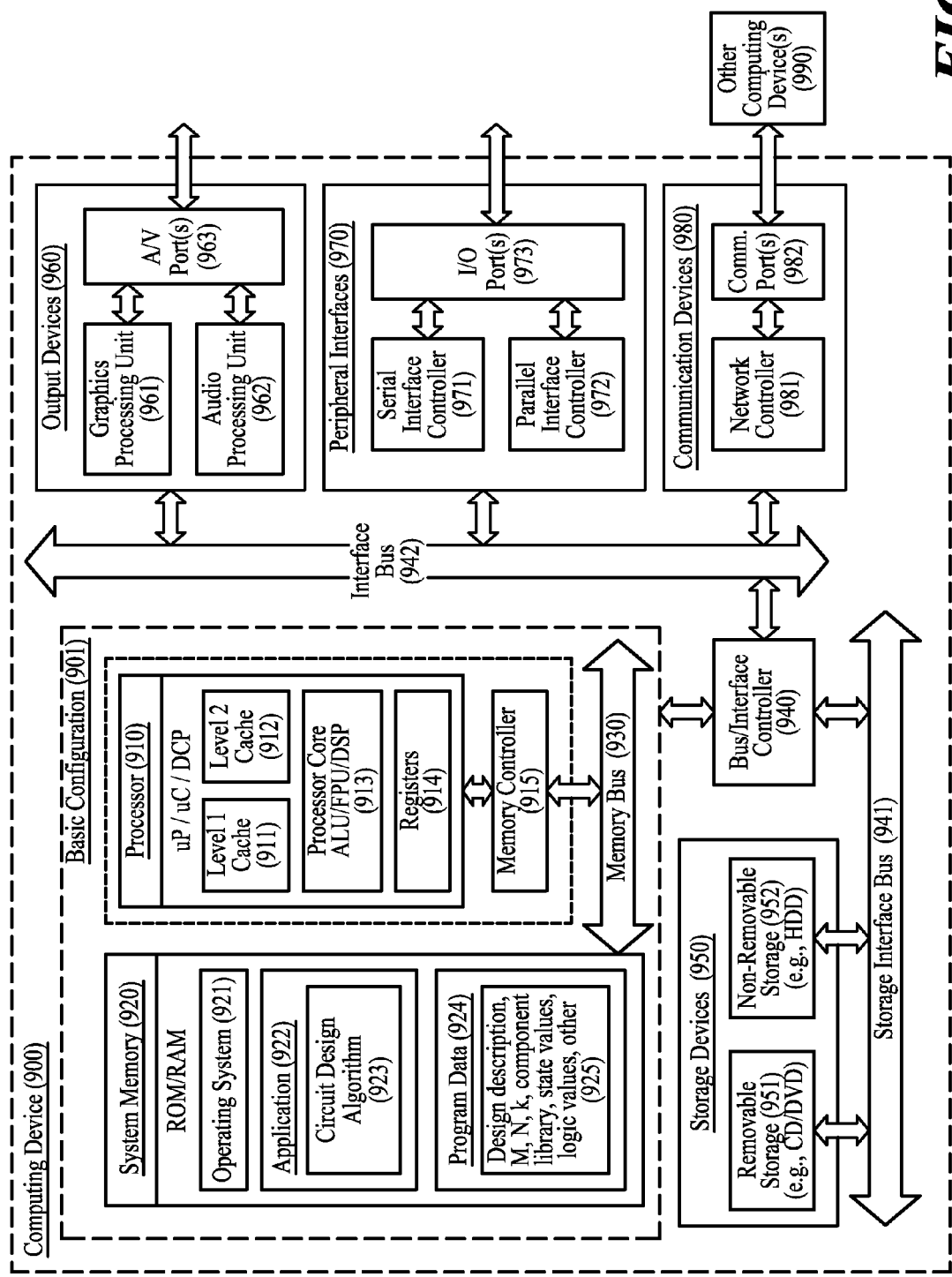
FIG. 9 illustrates an example computing device that may be suitable for practicing various embodiments, all arranged in accordance with embodiments of the present disclosure.

FIG. 9 is a block diagram illustrating an example computing device 900 that may be suitable for practicing various embodiments of the present disclosure. For example, the computing device 900 may be used to design the integrated circuit 102 having the N-variants 104-110 implemented thereon using the method 300 of FIG. 3 and/or the method 700 of FIG. 7.

In a very basic configuration 901, computing device 900 typically includes one or more processors 910 and system memory 920. A memory bus 930 may be used for communicating between the processor 910 and the system memory 920.

Depending on the desired configuration, processor 910 may be of any type including but not limited to a microprocessor (µP), a microcontroller (µC), a digital signal processor (DSP), or any combination thereof. Processor 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof. An example memory controller 915 may also be used with the processor 910, or in some implementations the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Application 922 may include programming instructions 923 to perform the operations associated with the methods 300 and 700. In particular, the programming instructions 923 may include instructions for performing a circuit design algorithm, such as described above with respect to methods 300 and 700, to design and synthesize a circuit having N-variants from an original input circuit design. Program Data 925 may include the input design description, the various values of m, N, k, etc., described above, the component library that provides the FF, logic gates, and other circuit building block components, state values of the FSMs, values of the logic circuits (e.g., $logic_1=0$), at least some of the programming instructions 923, and/or other information or content.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

In another embodiment, the computing device 900 may be an implementation of the device 100 of FIG. 1, rather than being a computing device used for the circuit design process. For instance, the media player 500 of FIG. 5 may be implemented in the computing device 900 of such another embodiment.

In such embodiment(s) where the computing device 900 may be the implementation of the device 100, the application 922 may include programming instructions 923 to perform the operations associated with using the N-variants 104-110. For instance in the context of the media player 500, the programming instructions 923 may include an algorithm to playback the input video 504 using one or more of the variants to process the input video 504. The programming instructions 923 may also include an algorithm to select a particular one of the variants to use, to control selection of an input and an output of the variants, and/or to otherwise control or manage operation of the variants.

In such embodiment(s) where the computing device 900 may be the implementation of the device 100, the program data 925 may include IDs of the variants and/or the IC 102 in connection with IP protection and DRM 602, values for the usage and content metering 604, the identification of the optimal variant for the IC 102, video data for the media player 500, at least some of the programming instructions 923, and/or any other information or content associated with using and operating the variants for the particular application/use of the computing device 900.

In conclusion, embodiments have been described herein of an N-variant design method that creates N≧2 copies of the same circuit design at a functional specification level. An IC implementing the N-variant circuits may then be synthesized and used for a variety of applications, in a manner that input signal(s) to the N-variants may be managed depending on the particular application to be used.

All of the above U.S. patents, U.S. patent application publications, U.S. patent applications, foreign patents, foreign patent applications and/or non-patent publications referred to in this specification and/or listed in the Application Data Sheet, are incorporated herein by reference, in their entirety.

Claimed subject matter is not limited in scope to the particular implementations described herein. For example, some implementations may be in hardware, such as employed to operate on a device or combination of devices, for example, whereas other implementations may be in software and/or firmware. Likewise, although claimed subject matter is not limited in scope in this respect, some implementations may include one or more articles, such as a storage medium or storage media. This storage media, such as CD-ROMs, computer disks, flash memory, or the like, for example, may have instructions stored thereon, that, when executed by a system, such as a computer system, computing platform, or other system, for example, may result in execution of a processor in accordance with claimed subject matter, such as one of the implementations previously described, for example. As one possibility, a computing platform may include one or more processing units or processors, one or more input/output devices, such as a display, a keyboard and/or a mouse, and one or more memories, such as static random access memory, dynamic random access memory, flash memory, and/or a hard drive.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

In the preceding description, various aspects of claimed subject matter have been described. For purposes of explanation, specific numbers, systems and/or configurations were set forth to provide a thorough understanding of claimed subject matter. However, it should be apparent to one skilled in the art and having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now, or in the future, occur to those skilled in the art. It is, therefore, to be understood that the appended claims are intended to cover all such modifications and/or changes as fall within the true spirit of claimed subject matter.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that individual function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed is:

1. A method of designing an integrated circuit (IC), the method comprising:
   designing, at a functional/behavioral specification level, a variable circuit design; and
   designing, by a computer, the IC with inseparable N physical variants of the circuit design in the IC, wherein the N physical variants perform a same function as that described in the circuit design and wherein at least one of the N physical variants is selectable to operate according to an application of the IC.

2. A method of designing an integrated circuit (IC), the method comprising:
- designing, at a functional/behavioral specification level, a variable circuit design; and
- designing, by a computer, the IC with inseparable N physical variants of the circuit design in the IC, wherein the N physical variants perform a same function as that described in the circuit design and wherein the designing the IC with N physical variants of the circuit design includes:
- manipulating a finite state machine of the circuit design to include multiple redundant states, wherein combinations of the states implement versions of the finite state machine; and
- modifying inputs to the finite state machine so that each of the versions of the finite state machine is selectable according to an input specification.

3. The method of claim 2 wherein the multiple redundant states are implemented in either don't care states of the finite state machine or as additional flip-flops of the finite state machine.

4. The method of claim 2 wherein flip-flops in the manipulated finite state machine yield a different set of output states depending on the input specification.

5. The method of claim 2 wherein the manipulating the state machine to include multiple redundant states comprises:
- adding redundant states in specific areas of a state transition graph that represents the finite state machine of the circuit design;
- modifying inputs of the finite state machine so that the inputs control the added states; and
- adding outputs to the state transition graph, wherein flip-flops of the finite state machine and of the versions of the finite state machine store the added states.

6. The method of claim 1 wherein the designing the IC with N physical variant of the circuit design includes:
- designing a finite state machine of the circuit design, the finite state machine representing a computational model present in all of the N physical variants and including a first combinational circuit coupled to an input, a second combinational circuit coupled to an output, and flip-flops coupled between the first and second combinational circuits; and
- modifying the finite state machine to include multiple redundant states.

7. The method of claim 6 wherein the modifying the state machine to include multiple redundant states comprises:
- replicating each of the flip-flops m times, wherein m^(a number of the flip-flops)=N;
- partitioning the first combinational circuit into a first logic circuit and a second logic circuit;
- replicating the first logic circuit m times to provide first replicated circuits;
- partitioning the second combinational circuit into a third logic circuit and a fourth logic circuit;
- replicating the third logic circuit m times to provide second replicated circuits;
- designing obfuscation logic, for insertion between the second logic circuit and the first replicated circuits, to select between the N physical variants and to generate values for unused flip-flops; and
- designing selection logic, for insertion between the second replicated circuits and the fourth logic circuit, to select an output of a particular one of the N physical variants.

8. The method of claim 6 wherein the designing the IC with N physical variants of the circuit design in the IC further includes providing a selection key input to control the obfuscation logic and the selection logic.

9. The method of claim 2 wherein the redundant states are added at a pre-synthesis stage to enable the added redundant states to be inseparable from original states at a post-synthesis stage.

10. The method of claim 2 wherein the manipulating the finite state machine includes partially modifying the finite state machine such that only a subset of states in the finite state machine is manipulated to contain N physical variants.

11. A method of designing an integrated circuit (IC), the method comprising:
- designing, at a functional/behavioral specification level, a variable circuit design; and
- designing, by a computer, the IC with inseparable N physical variants of the circuit design in the IC, wherein the N physical variants perform a same function as that described in the circuit design and wherein the designing the IC with N physical variants includes designing inputs to select a particular one of the N physical variants, wherein the inputs are modifiable during operation of the IC or during a post-synthesis stage of the IC to enable the selected particular one of the N physical variants to be changed.

12. The method of claim 1 wherein the designing the IC with N physical variants of the circuit design includes designing the N physical variants from a behavioral description that specifies functions of a single variant.

13. A method of designing an integrated circuit (IC), the method comprising:
- designing, at a functional/behavioral specification level, a variable circuit design; and
- designing, by a computer, the IC with inseparable N physical variants of the circuit design in the IC, wherein the N physical variants perform a same function as that described in the circuit design and wherein the designing the IC with N physical variants of the circuit design includes altering states of a finite state machine of the circuit design so as to obtain the N physical variants.

14. The method of claim 1 wherein the designing the IC with N physical variants of the circuit design in the IC includes implementing the N physical variants at a lower level of abstraction than the functional specification level.

15. The method of claim 14 wherein the designing the IC with N-variants of the circuit design includes designing the IC with N physical variants of the circuit design at a lower level of abstraction that includes a layout of the IC.

16. The method of claim 1 wherein the designing the IC with N physical variants of the circuit design includes designing the N physical variants to be inextricable from the IC.

17. The method of claim 1 wherein the designing the N physical variants includes designing each of the N physical variants to share a common plurality of flip-flops, wherein each of the N physical variants uses less than all of the flip-flops to operate, and wherein at least one flip-flop that enables a particular variant to operate is different from a flip-flop that enables at least one other variant to operate.

18. The method of claim 1 wherein the designing the IC with N physical variants includes embedding the N physical variants into the IC using a single mask without modification of the mask in order to generate each of the N physical variants.

19. An article of manufacture, comprising:
- a tangible computer-readable medium; and
- a plurality of computer-executable instructions stored on the tangible computer-readable medium, wherein the computer-executable instructions, when executed by a processor of an apparatus, cause the apparatus to perform a method including:
assisting a designer to design, at a functional specification level, a variable circuit design; and
assisting the designer to design an integrated circuit (IC) with inseparable N physical variants of the circuit design, wherein the N physical variants perform a same function as that described in the circuit design and wherein at least one of the N physical variants is selectable to operate according to an application of the IC.

20. The article of manufacture of claim 19 wherein the computer-executable instructions, when executed, cause the apparatus to perform:
designing a finite state machine of the circuit design, the finite state machine representing a computational model present in all of the N physical variants and including a first combinational circuit coupled to an input, a second combinational circuit coupled to an output, and flip-flops coupled between the first and second combinational circuits; and
modifying the finite state machine to include multiple redundant states by:
replicating each the flip-flops m times, wherein m^(a number of the flip-flops)=N;
partitioning the first combinational circuit into a first logic circuit and a second logic circuit;
replicating the first logic circuit m times to provide first replicated circuits;
partitioning the second combinational circuit into a third logic circuit and a fourth logic circuit;
replicating the third logic circuit m times to provide second replicated circuits;
designing obfuscation logic, for insertion between the second logic circuit and the first replicated circuits, to select between the N physical variants and to generate values for unused flip-flops; and
designing selection logic, for insertion between the second replicated circuits and the fourth logic circuit, to select an output of a particular one of the N physical variants.

21. An article of manufacture, comprising:
a tangible computer readable medium; and
a plurality of computer executable instructions stored on the tangible computer readable medium, wherein the computer executable instructions, when executed by a processor of an apparatus, cause the apparatus to perform a method including:
assisting a designer to design, at a functional specification level, a variable circuit design;
assisting the designer to design an integrated circuit (IC) with inseparable N physical variants of the circuit design, wherein the N physical variants perform a same function as that described in the circuit design; and
altering states of a finite state machine of the circuit design so as to obtain the N physical variants.

22. The article of manufacture of claim 19 wherein the computer-executable instructions, when executed, cause the apparatus to:
assist the designer in designing the IC with the N physical variants to be inextricable from the IC.

23. An apparatus, comprising:
an integrated circuit (IC) having formed thereon N physical variants of a same circuit design and that are generated from a functional specification level of the circuit design, wherein the N physical variants perform a same function as that described in the circuit design; and
a selection element configured to select at least one of the N physical variants to operate according to an application of the IC.

24. The apparatus of claim 23 wherein the N physical variants are integrated at the functional specification level of the circuit design so that the N physical variants are inextricable from hardware as physically synthesized on the IC.

25. The apparatus of claim 23 wherein the N physical variants are configured to share a common plurality of flip-flops, wherein each of the N physical variants is configured to use less than all of the flip-flops to operate, and wherein at least one flip-flop that is configured to enable a particular variant to operate is different from a flip-flop that is configured to enable at least one other variant to operate.

26. The apparatus of claim 23 wherein a finite state machine of the circuit design representing a computational model present in all of the N physical variants and includes a first combinational circuit coupled to an input, a second combinational circuit coupled to an output, and flip-flops coupled between the first and second combinational circuits, and
wherein the N-variants represent a modification of the finite state machine to include multiple redundant states, the modified state machine including:
the flip-flops replicated m times, wherein m^(a number of the flip-flops)=N;
the first combinational circuit partitioned into a first logic circuit and a second logic circuit, the first logic circuit being replicated m times;
the second combinational circuit partitioned into a third logic circuit and a fourth logic circuit, the third logic circuit being replicated m times;
obfuscation logic, coupled between the second logic circuit and the first logic circuit replicated m times, configured to select between the N physical variants and to generate values for unused flip-flops; and
selection logic, coupled between the third logic circuit replicated m times and the fourth logic circuit, configured to select an output of a particular one of the N physical variants.

27. The apparatus of claim 23 wherein the application includes one or more of intellectual property protection and digital rights management, usage and content metering, security, optimization of the IC according to manufacturing variability in the IC, self-adaptation of the IC, or fault-tolerance of the IC.

28. A method for operating an integrated circuit (IC) having formed thereon N physical variants of a same circuit design generated from a functional specification level of the circuit design, the method comprising:
selecting, by a computer, one or more of the N physical variants to configure the IC for a selected at least one application of the IC, wherein the N physical variants perform a same function as that described in the circuit design; and
distributing the IC for the selected application.

29. The method of claim 28 wherein the at least one application includes intellectual property protection and digital rights management.

30. The method of claim 28 wherein the at least one application includes usage and content metering.

31. The method of claim 28 wherein the at least one application includes security.

32. The method of claim 28 wherein the at least one application includes optimization of the IC according to manufacturing variability in the IC, the selection element being configured to select the at least one of the variants that has optimal performance in view of the manufacturing variability.

33. The method of claim 28 wherein the at least one application includes a selected one of a self-adaptation of the IC or a fault-tolerance of the IC.

34. The method of claim 28 wherein the selecting is performed after the distributing.

* * * * *

UNITED STATES PATENT AND TRADEMARK OFFICE
CERTIFICATE OF CORRECTION

| | | |
|---|---|---|
| PATENT NO. | : 8,176,448 B2 | Page 1 of 1 |
| APPLICATION NO. | : 12/479665 | |
| DATED | : May 8, 2012 | |
| INVENTOR(S) | : Koushanfar | |

It is certified that error appears in the above-identified patent and that said Letters Patent is hereby corrected as shown below:

On the Face Page, in Field (56), under "OTHER PUBLICATIONS", in Column 2, Lines 24-26, delete "Randell, B., ................... 1975, pp. 437-449." and insert the same as a new entry.

In Column 1, Line 60, delete "machine" and insert -- machines --, therefor.

In Column 2, Line 27, delete "procedures" and insert -- procedures, --, therefor.

In Column 4, Line 52, delete "N variants;" and insert -- N-variants; --, therefor.

In Column 10, Line 65, delete "29" and insert -- $2^9$ --, therefor.

In Column 15, Line 59, delete "etc," and insert -- etc., --, therefor.

In Column 16, Line 8, delete "(HDD)," and insert -- (HDDs), --, therefor.

In Column 16, Line 10, delete "(SSD)," and insert -- (SSDs), --, therefor.

In Column 16, Line 21, delete "(DVD)" and insert -- (DVDs) --, therefor.

In Column 21, Line 37, in Claim 6, delete "variant" and insert -- variants --, therefor.

Signed and Sealed this
Eighth Day of January, 2013

David J. Kappos
*Director of the United States Patent and Trademark Office*